(12) United States Patent
Goh et al.

(10) Patent No.: US 8,205,183 B1
(45) Date of Patent: Jun. 19, 2012

(54) INTERACTIVE CONFIGURATION OF CONNECTIVITY IN SCHEMATIC DIAGRAM OF INTEGRATED CIRCUIT DESIGN

(75) Inventors: Denis Chuan Hu Goh, Gelugor (MY); Goet Kwone Ong, Bayan Lepas (MY); Chai Pin Chew, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 384 days.

(21) Appl. No.: 12/562,889

(22) Filed: Sep. 18, 2009

(51) Int. Cl.
*G06F 17/50* (2006.01)
(52) U.S. Cl. ......... 716/126; 716/129; 716/130; 716/139
(58) Field of Classification Search ................... 716/126, 716/129, 130, 139
See application file for complete search history.

(56) References Cited

U.S. PATENT DOCUMENTS

| | | | | |
|---|---|---|---|---|
| 3,902,026 A * | 8/1975 | Rogers et al. | ................... | 324/66 |
| 4,821,034 A * | 4/1989 | Anderson et al. | ............. | 340/2.22 |
| 5,220,512 A * | 6/1993 | Watkins et al. | ................ | 716/102 |
| 5,325,309 A * | 6/1994 | Halaviati et al. | ................. | 703/15 |
| 6,216,258 B1 * | 4/2001 | Mohan et al. | .................. | 716/117 |
| 6,240,541 B1 * | 5/2001 | Yasuda et al. | .................. | 716/112 |
| 6,629,305 B2 * | 9/2003 | Ito et al. | ......................... | 716/119 |
| 6,971,082 B2 * | 11/2005 | Shiratori | ........................ | 716/115 |
| 2002/0023107 A1 * | 2/2002 | Gont et al. | ..................... | 707/504 |

* cited by examiner

*Primary Examiner* — Sun Lin
(74) *Attorney, Agent, or Firm* — Mauriel Kapouytian & Treffert LLP; Michael Mauriel

(57) ABSTRACT

Methods, computer program products, and systems for interactively configuring the display of connectivity of a schematic diagram based on an integrated circuit ("IC") design are provided. Using a set of criteria, the schematic diagram can be configured to reduce visual congestion caused by interconnections among circuit elements in the IC design. The criteria include interconnections having a specific number of fan-outs, interconnections connecting ports of specific types, interconnections connecting selected types of circuit elements, and interconnections connecting circuit elements with specific names. The amount of clutter caused by individual nets can also be reduced based on the total congestion score associated with each net. The total congestion score is calculated based on the number of bends that a net makes, the number of crossovers that a net makes, and the number of pixels required to draw the net. Configuration of the connectivity in a schematic diagram is performed through a graphical user interface on a display device, which is connected to a computer system.

20 Claims, 17 Drawing Sheets

INTERACTIVE CONFIGURATION OF CONNECTIVITY IN SCHEMATIC DIAGRAM OF INTEGRATED CIRCUIT DESIGN

BACKGROUND

This invention relates to the computer display of schematic diagrams, specifically in the context of integrated circuit ("IC") design.

Electronic design automation ("EDA") systems assist in the design of electronic circuits by providing a user with a set of software tools running on a digital computer with a graphical display device. These systems generally include a schematic diagram editor, which is usually an interactive tool that produces a graphical representation of the circuit elements and the interconnections among the circuit elements on a graphical display. The schematic diagram editor enables the user to select from a number of circuit elements on the display screen, which is connected to the computer.

The process of designing an IC device is done in several steps on a typical EDA system. One of the steps involves analyzing the schematic diagram of the design to determine if the circuit will perform correctly when it is constructed. If not, the user may then edit the schematic diagram using the schematic diagram editor. This process is performed iteratively until the user is satisfied that the design of the circuit is correct.

In modern digital systems, IC designs incorporating thousands of circuit elements or more are not uncommon. These designs, due to their complexity, result in large and cluttered schematic diagrams that are hard to analyze and debug. Traversing through unwieldy schematic diagrams in search of a particular circuit element or tracing through interconnections can consume a substantial amount of time. FIG. 1 shows an exemplary schematic diagram of a typical IC design. The exemplary schematic diagram is overcrowded with graphical representations of the interconnections among circuit elements, rendering it difficult for a user to analyze the design efficiently. It is, therefore, desirable to have less cluttered schematic diagrams that the user can detect errors and edit iteratively with ease.

Existing methods for displaying schematics of an IC device allow the user to specify one specific interconnection at a time to be hidden. Such a method is used in the Block Editor tool in the Quartus® II software from Altera Corporation in San Jose, Calif. However, this does not offer a practical solution for designs with a large number of interconnections that need to be hidden. In some IC floorplan viewing tools, such as the Floorplan Editor tool in the Quartos® II software, one can hide either all fan-in or all fan-out connections. However, such tools do not apply to displaying schematic diagrams (which show individual circuit element types). Furthermore, when such tools hide connections, they do not allow for representing the hidden connections in an alternative manner that shows the connection with minimal visual clutter.

Therefore, an efficient way of configuring the display of interconnections shown in an IC schematic diagram to control visual clutter is needed.

SUMMARY

Embodiments of the present invention provide methods, computer program products, and systems to configure the display of wire connectivity in the schematic diagram of an IC design. The display of interconnections among circuit elements in the schematic diagram can be configured based on user-selected criteria aimed at reducing visual congestion in the schematic diagram. The schematic diagram is displayed through a graphical user interface ("GUI") on a display device coupled to a computer system.

It should be appreciated that the present invention can be implemented in numerous ways, such as a process, an apparatus, a system, a device, or a computer program product. Several inventive embodiments of the present invention are described below.

In one embodiment, based on user-selected criteria, either net labels or connection lines are used to represent the interconnections among circuit elements in the schematic diagram of an IC design. A connection line represents a net or interconnection from the output port of a circuit element to one or more input ports of another circuit element. On a schematic diagram, a connection line is a graphical line that spans an interconnection with the interconnection corresponding to a portion of a net or a bus. A net label can be used in place of a connection line to represent the net. A unique net label is used for each distinet net.

In one embodiment, based on user-selected criteria, a connection line can be used to represent all or selected connection paths of a net in the schematic diagram of an IC design. Connection paths that are not represented by connection lines are represented by net labels.

In one embodiment, based on user-selected criteria, net labels or connection lines are used to represent bus nets in the schematic diagram of an IC design. A connection line represents a bus net from the output port of a circuit element to one or more input ports of another circuit element. A net label can be used in place of a connection line to represent the bus net.

In one embodiment, based on user-selected criteria, a connection line can be used to represent all or selected connection paths of a bus net in the schcmatic diagram of an IC design. Connection paths that are not represented by connection lines are represented by net labels. A unique net label is used to identify each distinct bus net.

In one embodiment, the criteria to display the interconnections in a schematic diagram are made available for user selection through a GUI. The GUI is displayed on a display device coupled to a computer system. After user selection is made through the GUI, the identified criteria are used in displaying the connectivity among the elements in the schematic diagram.

In one embodiment, the criteria for displaying interconnections in a schematic diagram include displaying interconnections with a selected number of fan-outs, interconnections connecting particular types of circuit element ports, interconnections connecting circuit elements of specific types, and interconnections selected based on a congestion score.

In one embodiment, the congestion score is calculated based on factors that cause visual congestion in the schematic diagram of an IC design. The factors include the number of bends that an interconnection makes, the number of crossovers that an interconnection makes, and the number of pixels required to draw an interconnection.

In one embodiment, the congestion score caused by interconnections on the schematic diagram of an IC design is calculated by obtaining a measurement of each factor that causes visual congestion. As not each factor contributes an equal amount of significance in terms of visual congestion, each factor is assigned a weight. The weight for each factor is determined by the user. After that, the congestion score of each factor is calculated by multiplying the weight with the measurement of the factor. The total congestion score is calculated by combining the congestion scores for all factors.

Other aspects and advantages of the embodiments of the invention will become apparent from the following detailed description, taken in conjunetion with the accompanying drawings.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
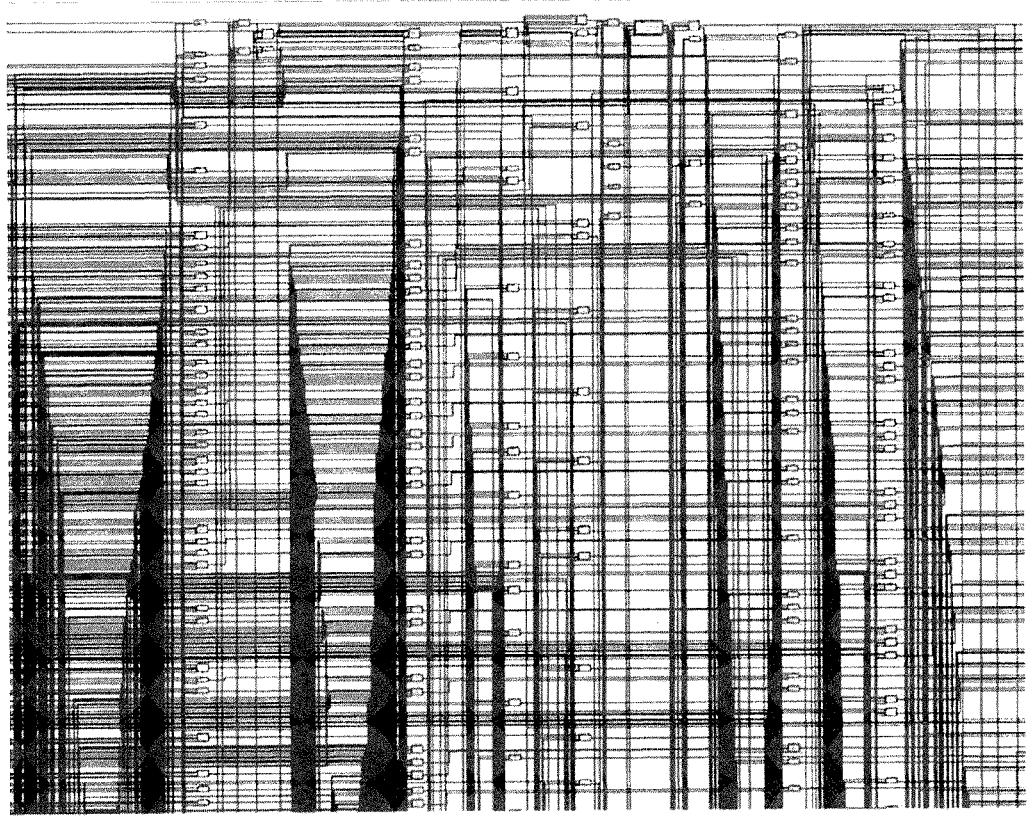
FIG. 1 shows an exemplary schematic diagram of a typical IC design.
Figure 2:
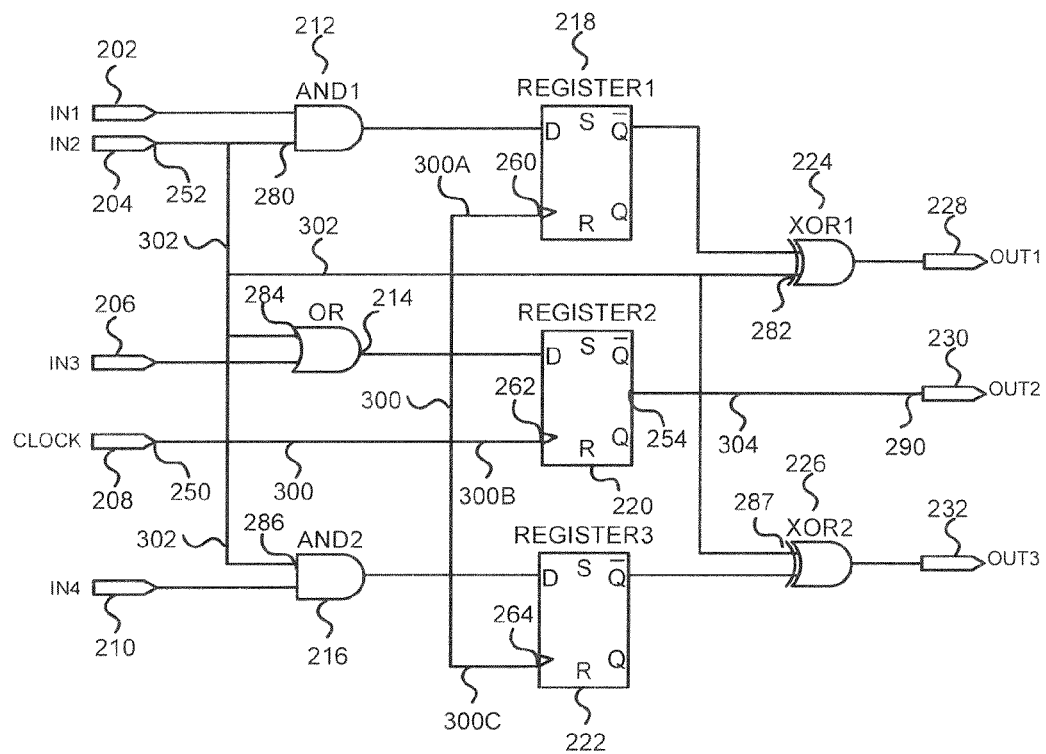
FIG. 2 shows an exemplary schematic diagram with schematic symbols and the nets interconnecting the schematic symbols, according to one embodiment of the present invention.

FIG. 2 shows an exemplary schematic diagram 200 with schematic symbols and the nets interconnecting the schematic symbols. The display of these interconnections can be configured according to one embodiment of the present invention.

In schematic diagram 200, a schematic symbol is a graphical representation of a circuit element in an IC design. Examples of circuit elements include logic gates, capacitors, resistors, inductors, switches, input pins, and output pins. Each schematic symbol has input and/or output ports or connection points to which input and/or output signals are associated. In FIG. 2, schematic symbols 202, 204, 206, 208, 210 represent input pins IN1, IN2, IN3, CLOCK, and 1N4 pins, respectively. Schematic symbols 212, 214, 216, 218, 220, 222, 224, and 226 represent circuit elements AND1, OR, AND2, REGISTER1, REGISTER2, REGISTER3, XOR1, and XOR2, respectively. Schematic symbols 228, 230, and 232 represent output pins OUT1, OUT2, and OUT3, respectively.

In FIG. 2, the schematic symbols are connected by connection lines representing the interconnections or connection paths between the input ports and output ports. A connection line is a graphical line that spans an interconnection, where the interconnection corresponds to one or more connection paths in the net. In FIG. 2, all interconnections of schematic diagram 200 are displayed by connection lines.

An interconnection that connects the output port of a circuit element to one or more input ports of one or more other element is known as the net of the connected circuit elements. A net originates from an output port of a circuit element; therefore it is said to be "driven" by the output port. A net also connects to an input port of a circuit element; therefore it is said to be "driving" the input port. A net that is driven by an output port can drive one or more input ports. In FIG. 2, net 300 is driven by output port 250 of CLOCK pin 208 and drives the input port 260 of REGISTER 218, input port 262 of REGISTER 220, and input port 264 of REGISTER 222, Net 302 is driven by output port 252 of input pin 204 and drives input port 280 of AND gate 212, input port 282 of XOR gate 224, input port 284 of OR gate 214, input port 286 of AND gate 216, and input port 287 of XOR gate 226. Net 304 is driven by output port 254 of REGISTER 220 and drives input port 290 of output pin 230.

The different connection paths of a net are typically referred to as fan-outs or fan-ins. For example, a net may have several connections paths or fan-outs from one circuit element to another. In FIG. 2, net 300 connects to three different ports and is therefore said to have three fan-outs or connection paths: fan-out or connection path 300A from CLOCK pin 208 to REGISTER 218, fan-out or connection path 300B from CLOCK pin 208 to REGISTER 220, and fan-out or connection path 300C from CLOCK pin 208 to REGISTER 222. For case of explanation, the invention will be described with reference to fan-out nets rather than fan-in nets. However, the principles are equally applicable to both.

In one embodiment, the connectivity between circuit elements on a schematic diagram is displayed based on user-selected criteria. The criteria to display the connectivity in a schematic diagram are shown through a graphical user interface ("GUI") on a display device, which is coupled to a computer system. User selection is also made through the GUI and communicated to the computer system via a cursor positioning device, which can be a pointing device such as a mouse, trackball, joystick, graphic tablet, or keyboard used to enter coordinates on the display device and commands to the computer system.

In one embodiment, the criteria to display connectivity in a schematic diagram are aimed at reducing visual congestion in the schematic diagram by decreasing the number of nets displayed. Connection lines for nets that are deemed unnecessary to display will be hidden from a user's view. In other words, the connection paths in the net will not be visually depicted with connection lines. However, the change in the visual representation of connectivity in the schematic diagram does not change the underlying logic of the IC design represented on the schematic diagram.

In one embodiment, net labels are used to identify nets that are not represented with connection lines in a schematic diagram. A net label is a unique identifier for each net in the schematic diagram of an IC design. The same net label is used for all connection paths in the same net, while different net labels are used for the connection paths of different nets. A net label can be an alphabet character such as "a", "b", or "c". The embodiments described herein refer to drawings that use alphabet characters as net labels. The representation of net labels as alphabet characters are shown by way of example and not meant to be limiting. One skilled in the art will appreciate that different representations of net labels may be used in other embodiments as long as the net label that identifies each distinct net is unique. For example, net labels can also be represented with a combination of alphabet characters, a numeric character, a combination of numeric characters, or a combination of alphanumeric characters.

Figure 3:
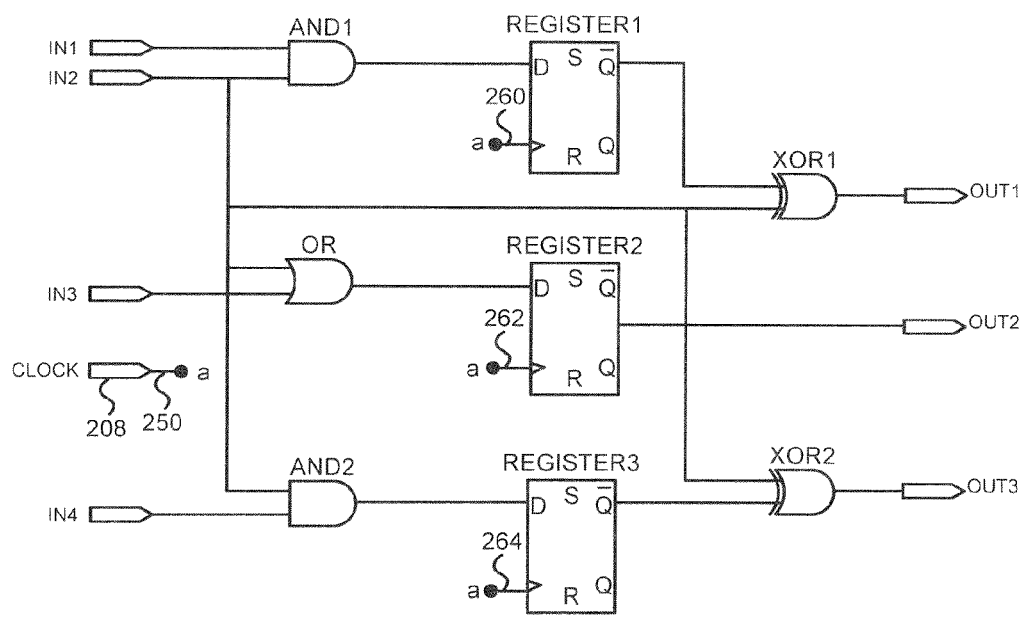
FIG. 3 illustrates an embodiment in which the connectivity among circuit elements on a schematic diagram can be displayed based on interconnections connecting ports of specific types.

As illustrated in FIG. 3, in one embodiment, the connectivity among circuit elements on a schematic diagram can be displayed based on interconnections connecting ports of specific types. For example, certain types of ports such as clock ports and reset ports may be available on every circuit element associated with a particular net and the interconnections of such ports cause a lot of clutter on the display of a schematic diagram when displayed using connection lines. Therefore, a user can choose not to display the clock or reset signal connections using connection lines. FIG. 3 shows the resulting representation 200-3 of schematic diagram 200 in FIG. 2 after it has been configured to use not labels rather than connection lines to display connection paths from the clock pin 208. Net 300 referenced in FIG. 2 is a clock signal distribution net with three connection paths: from CLOCK pin 208 to REGISTER 218, REGISTER 220, and REGISTER 222. The connection lines that represent connection paths of net 300 are not displayed in FIG. 3, but are replaced with net labels "a". The net labels are shown at output port 250 of CLOCK pin 208 that drives the net. (Note that ordinarily a "pin" would not be referred to as having a "port", however, for purposes of precisely describing and claiming the invention disclosed herein, it is useful to reference "ports" in addition to the circuit element itself. Circuit elements other than pins often have multiple ports, so, for consistency in describing the invention, a pin is referenced as having a port). The net labels are also shown at input port 260, input port 262, and input port 264 that are being driven by the net. The net labels are shown at each port to represent the connectivity of the net without having to clutter the diagram with connection lines. As shown in FIG. 3, each port is represented visually as a short line with a connector point at the end. For example, port 250 has a connector point that is represented by solid circle at the end. The visual representations of the ports are shown by way of example and not meant to be limiting. One skilled in the art will appreciate that different representations of ports may be used in other embodiments. For example, the ports can be represented with a short line, a short line with a solid square, or a short line with an outlined circle.

Figure 4:
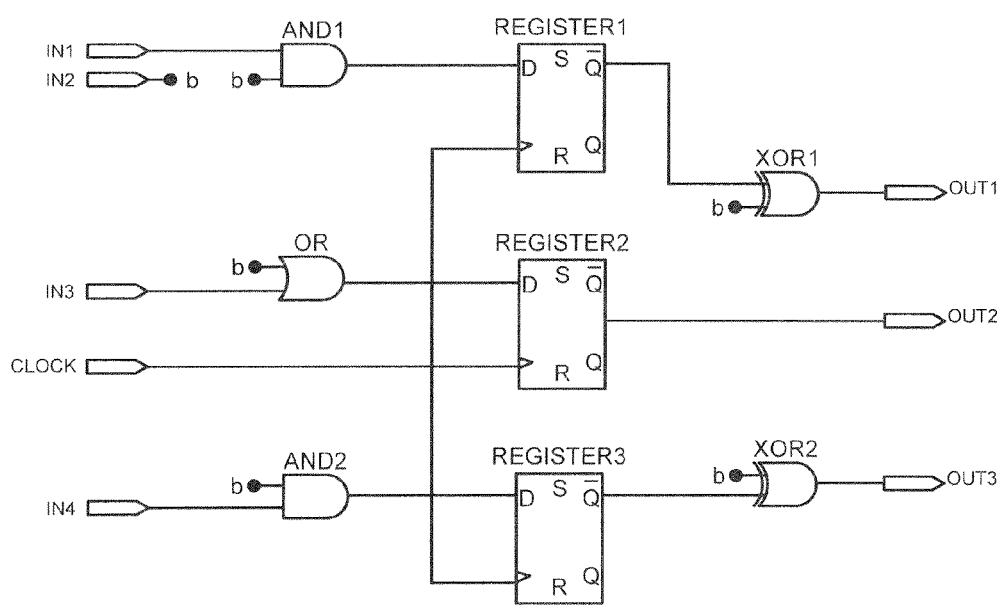
FIG. 4 illustrates an embodiment in which the connectivity among circuit elements on a schematic diagram can be displayed based on the number of fan-outs that a net has.

FIG. 4 illustrates an embodiment in which the connectivity among circuit elements on a schematic diagram can be displayed based on the number of fan-outs that a net has. Typically, the more fan-outs a net has the more clutter the net causes in a schematic diagram. Therefore, to reduce clutter, a user can choose to display connection lines only for interconnections with a specified number of fan-outs. FIG. 4 shows the resulting representation 200-4 of schematic diagram 200 in FIG. 2 after it has been configured to use net labels rather than connection lines to display nets with four or more fan-outs, according to one embodiment.

Connection paths of nets with more than four fan-outs are hidden and represented with net labels instead of connection lines. In FIG. 2, net 302 has a total of five fan-outs: from input pin 204 to AND gate 212, OR gate 214, AND gate 216, XOR gate 224, and XOR gate 226. The connection lines that represent connection paths of net 302 are not displayed in FIG. 4 and are replaced with net labels "b" instead.

In one embodiment, the connectivity among circuit elements on a schematic diagram can be displayed based on selected types of circuit elements. For example, the user can choose to hide the connection lines from all registers in a schematic diagram. Therefore, the connection lines that drive or are being driven by all registers will be replaced with net labels, However, the schematic symbols that represent the registers will still be displayed in the schematic diagram.

Figure 5:
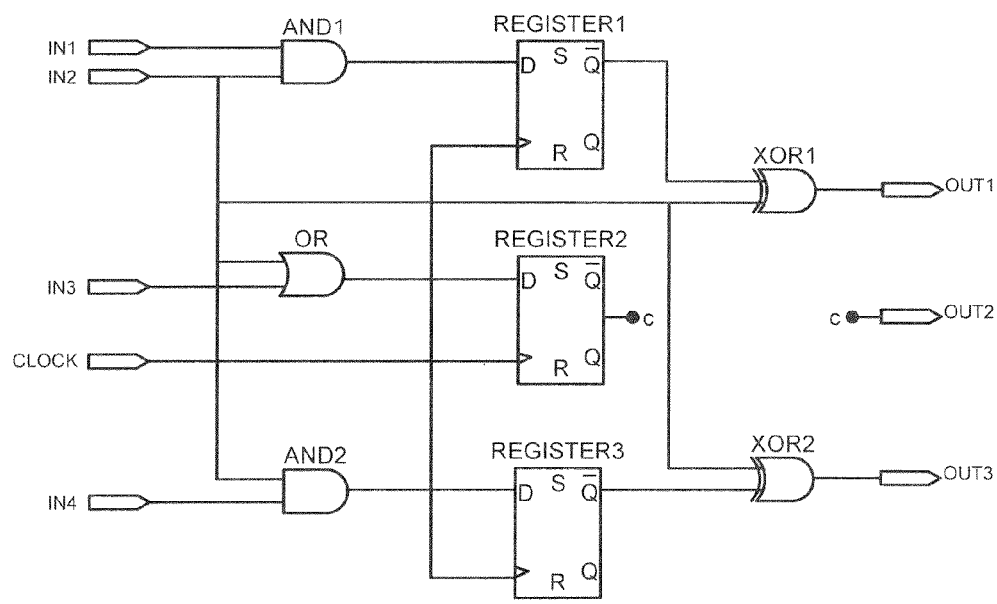
FIG. 5 illustrates an embodiment in which the connectivity among circuit elements on a schematic diagram can be displayed based on circuit elements with specific names.

FIG. 5 illustrates an embodiment in which the connectivity among circuit elements on a schematic diagram can be displayed based on circuit elements with specific names. For example, the user can choose to hide the connection lines to/from the output pin labeled as "OUT2". FIG. 5 shows the resulting representation 200-5 of schematic diagram 200 in FIG. 2 after it has been configured to use net labels rather than connection lines to represent the connection paths to/from output pin labeled as "OUT2". In FIG. 2, net 304 from the output port of REGISTER 220 is the only connection path to output pin "OUT2". In FIG. 5, the connection line for net 304 is not displayed and replaced with net label "c" instead.

Figure 6A:
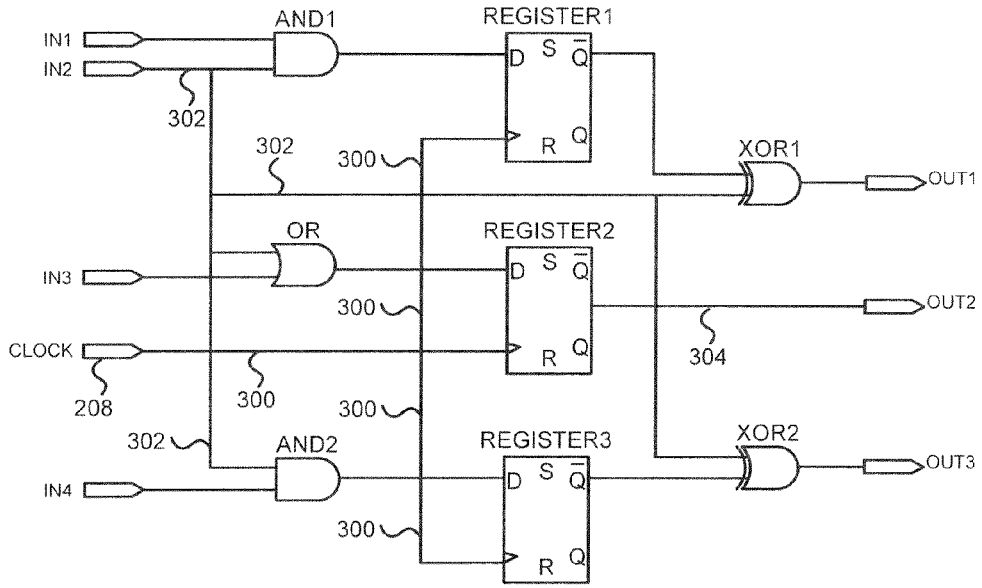
FIGS. 6A and 6B illustrate an embodiment in which the schematic diagram of an IC design can be simplified by using user-selected criteria aimed at reducing visual congestion in the schematic diagram.
Figure 6B:
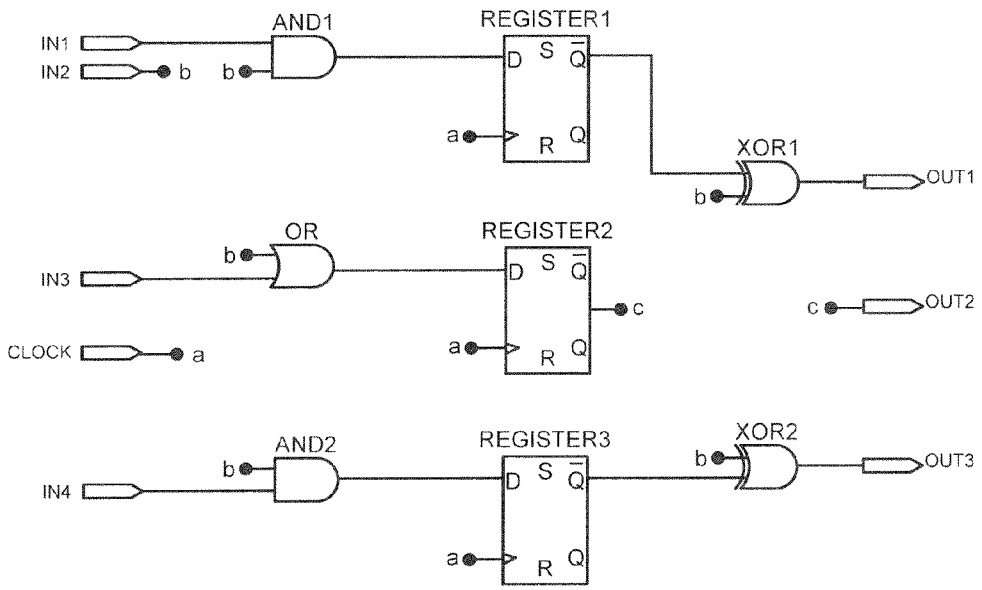

FIGS. 6A and 613 illustrate an embodiment in which the schematic diagram of an IC design can be simplified by using user-selected criteria aimed at reducing visual congestion in the schematic diagram. FIG. 6A shows schematic diagram 200 and FIG. 6B shows the resulting representation 200-6B of schematic diagram 200 after it has been simplified using user-selected criteria such as the number of fan-outs, specific port types, and circuit elements with specific names. By configuring the schematic diagram not to display connection paths from the clock pin, the connection lines of net 300 have been replaced with net labels "a". By configuring the schematic diagram to display only nets with four or less fan-outs, the connection lines of net 302 have been replaced with net labels "b". By configuring the schematic diagram to hide the connection paths to/from output pin "OUT2", the connection line of net 304 has been simplified to net label "c". With the use of net labels instead of connection lines, the user has better control in reducing the visual clutter in a schematic diagram.

FIGS. 7A, 7B, 8A, and 8B show embodiments, in which the net labels in a schematic diagram can be expanded to show the actual connection lines that the net labels represent. This can be done for all or selected connection paths of a net. The net labels can be expanded at the connector point of an output port that drives the net or at the connector point of an input port that is being driven by the net.

In one embodiment, if a net label is expanded at the output port, all the connection lines that represent a full net will be shown, whereas if a net label is expanded at the input port, only the connectivity between the particular output port and the input port will be shown. A cursor positioning device or a keyboard may be used for expanding the net labels. If a cursor positioning device is used, the user may click or hover on the net label. For example, to expand net label "a" in FIG. 3, the user can click or hover on the connector point at the end of output port 250, input port 260, input port 262, or input port 264. Clicking will display the nets on the schematic diagram until the user chooses to hide them again. However, hovering will only display the nets as long as the cursor is positioned over the connector point; the nets will not be displayed once the cursor is drawn away.

Figure 7A:
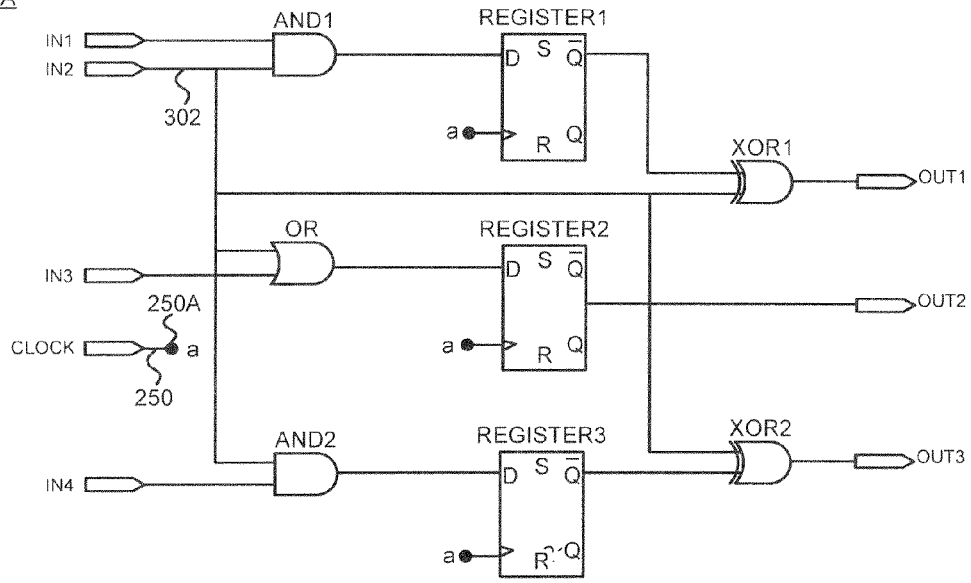
FIGS. 7A, 7B, 8A, and 8B show embodiments, in which the net labels in a schematic diagram can be expanded to show the actual connection lines that the net labels represent.
Figure 7B:
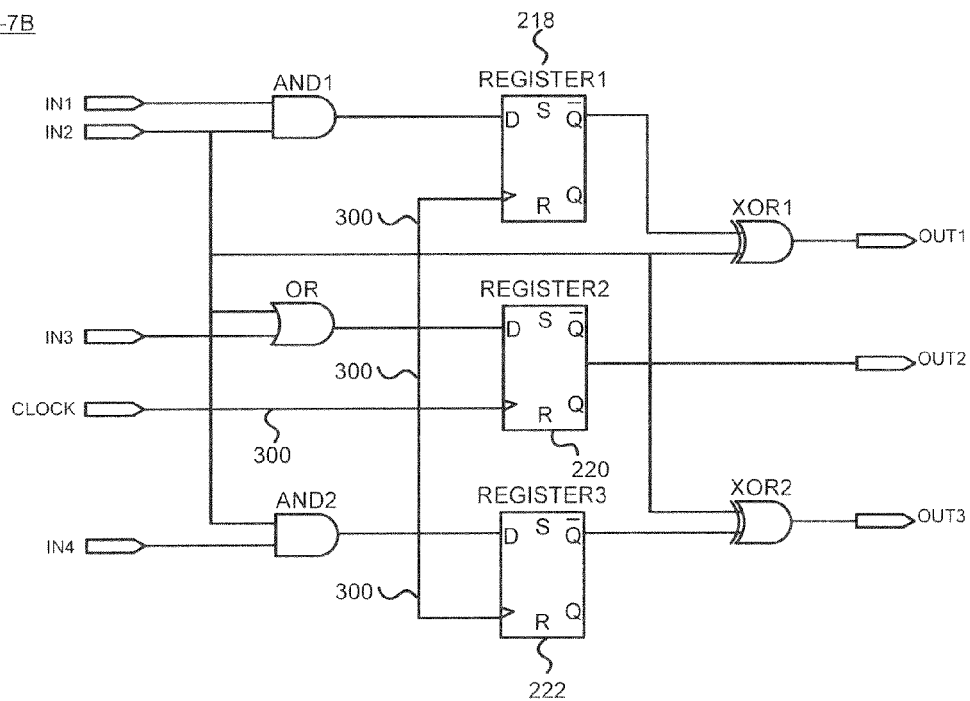

FIG. 7A shows a representation 200-7A of schematic diagram 200, As shown, net label "a" is at output port 250 with connector point 250A at its end. According to one embodiment, if solid circle 250A is expanded with a cursor positioning device, full net 300 will be displayed on the schematic diagram. FIG. 7B shows a representation 200-7B which expands the display of connection lines for the full net 300 (see FIG. 2) consisting of connection lines from CLOCK pin 208 to REGISTER 218, REGISTER 220, and REGISTER 222.

Figure 8A:
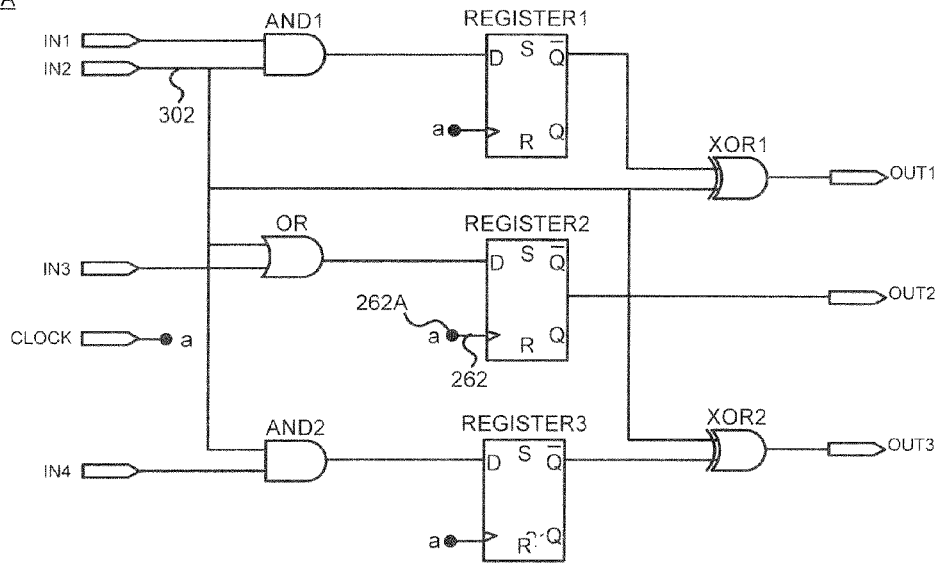
Figure 8B:
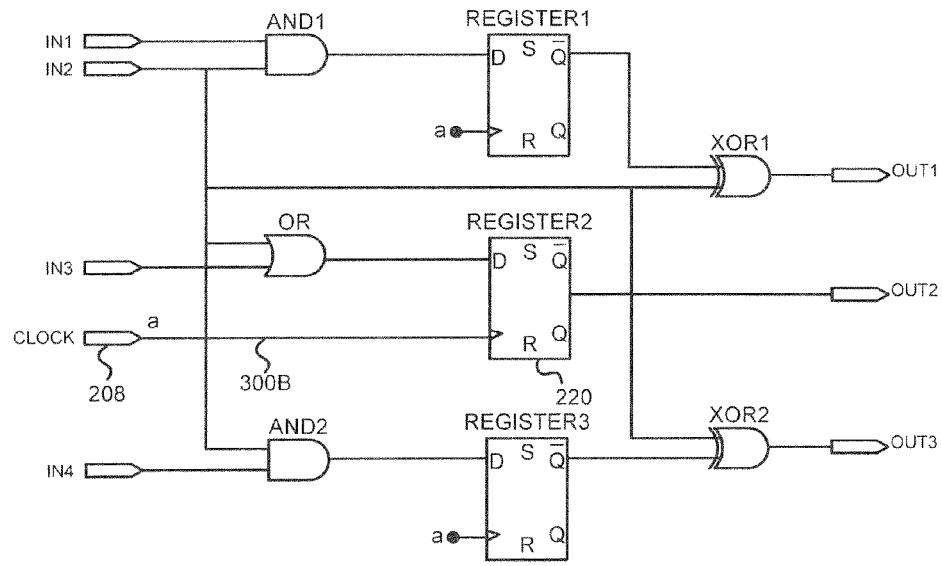

FIG. 8A shows a representation 200-8A that highlights net label "a" at input port 262, which has connector point 262A for input signals, according to one embodiment. If solid circle 262A is expanded with a cursor positioning device, only the connection path from CLOCK 208 to REGISTER 220 will be displayed on the schematic diagram. FIG. 8B shows a representation 200-8B with expansion of a portion 300B of net 300 to show only the connection line from CLOCK 208 to REGISTER 220.

Figure 9A:
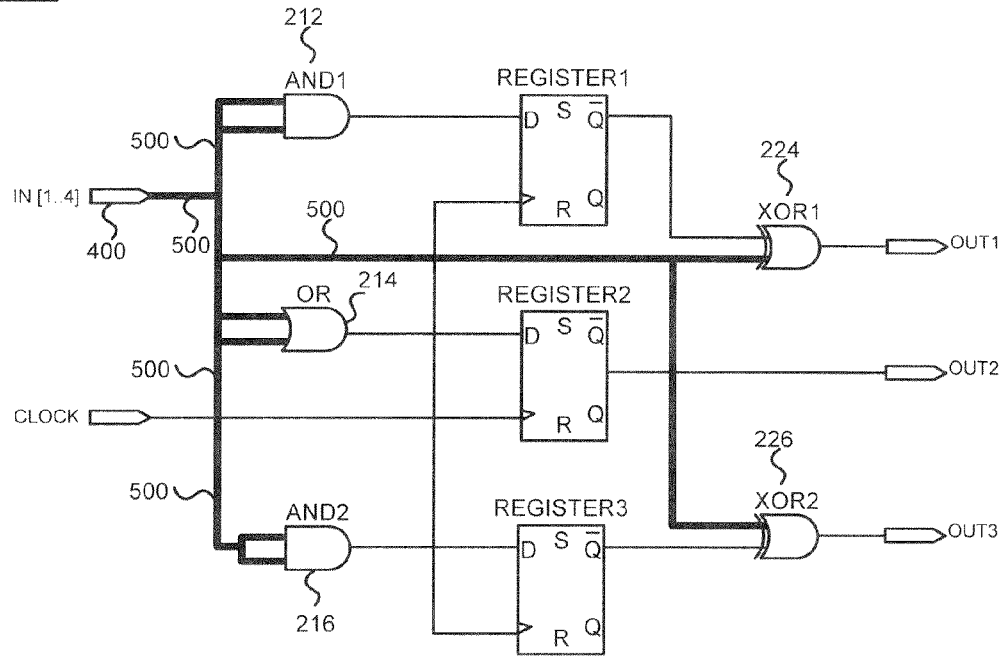
FIGS. 9A, 9B, 10A, and 10B illustrate how the embodiments described for nets herein also apply to bus nets.
Figure 9B:
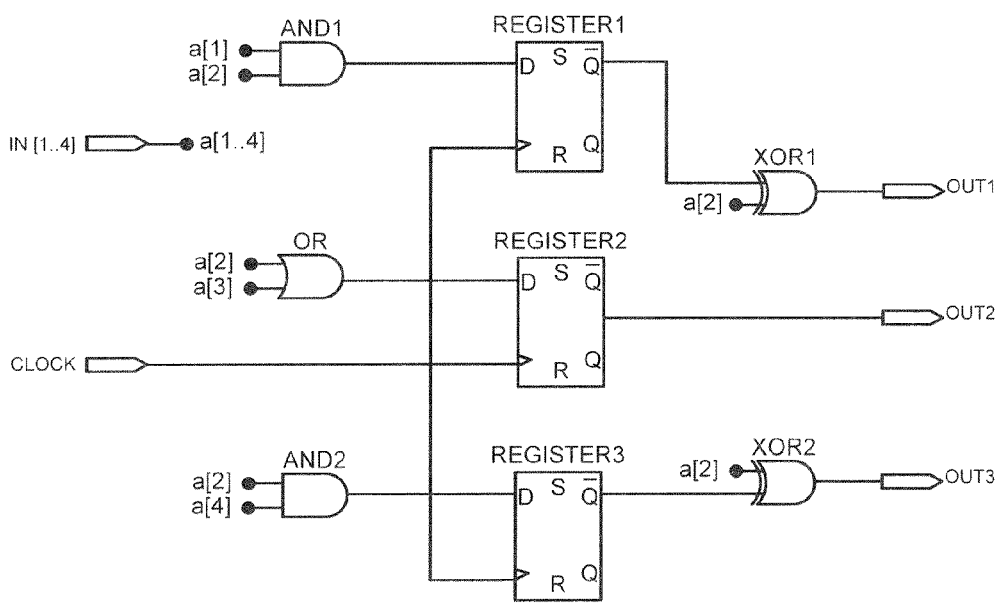

FIGS. 9A, 9B, 10A, and 10B illustrate how the embodiments described for nets herein also apply to bus nets. A bus net refers to a group of nets that connect the output port of a circuit element to one or more input ports of another circuit element. However, according to one embodiment, the net labels for bus nets differ from the net labels used for nets. FIG. 9A shows a representation 200-9A of schematic diagram 200. In representation 200-9A, input pins 202, 204, 206, and 210 of schematic diagram 200 in FIG. 2 are grouped into input bus IN[1 . . . 4] 400. Bus net 500 (highlighted in bold for illustrative purposes) connects IN[1 . . . 4] 400 to AND 212, OR 214, AND 216, XOR 224, and XOR 226. FIG. 9B shows a representation 200-9B using net bus labels to represent the connection paths alms net 500. The bus net labels are indexed to identify the different nets in the bus net. Bus net labels with the same index represent connection paths in the same net. For example, bus net label a[2] in FIG. 9B represents connection paths from net 302 in FIG. 2.

Figure 10A:
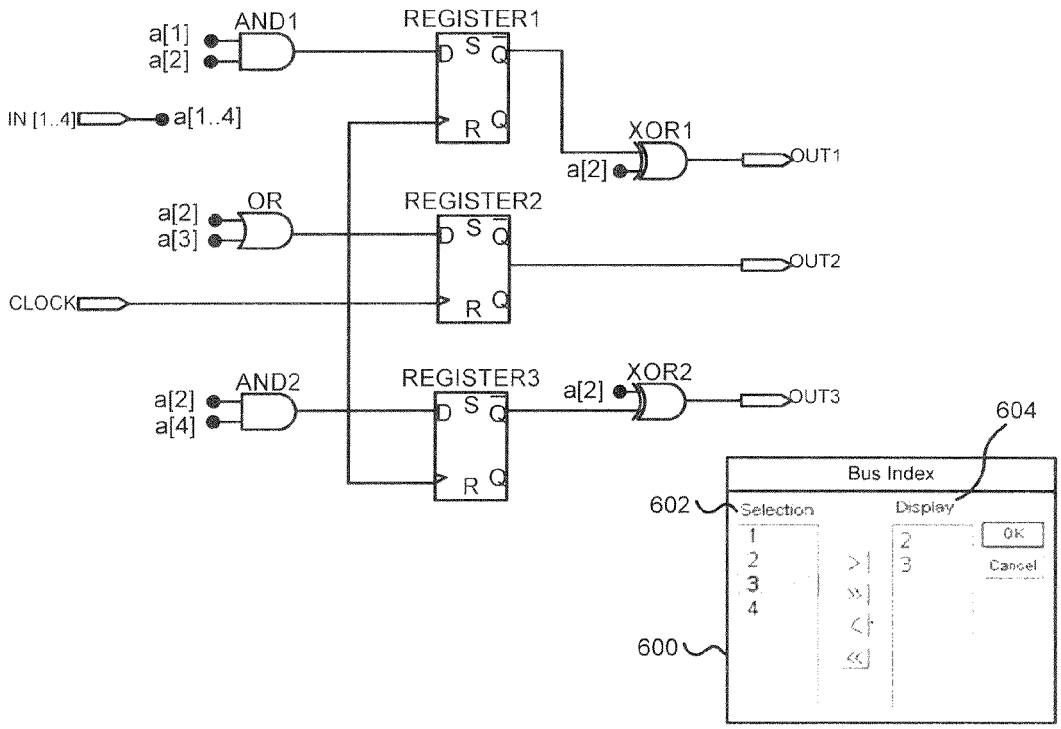
Figure 10B:
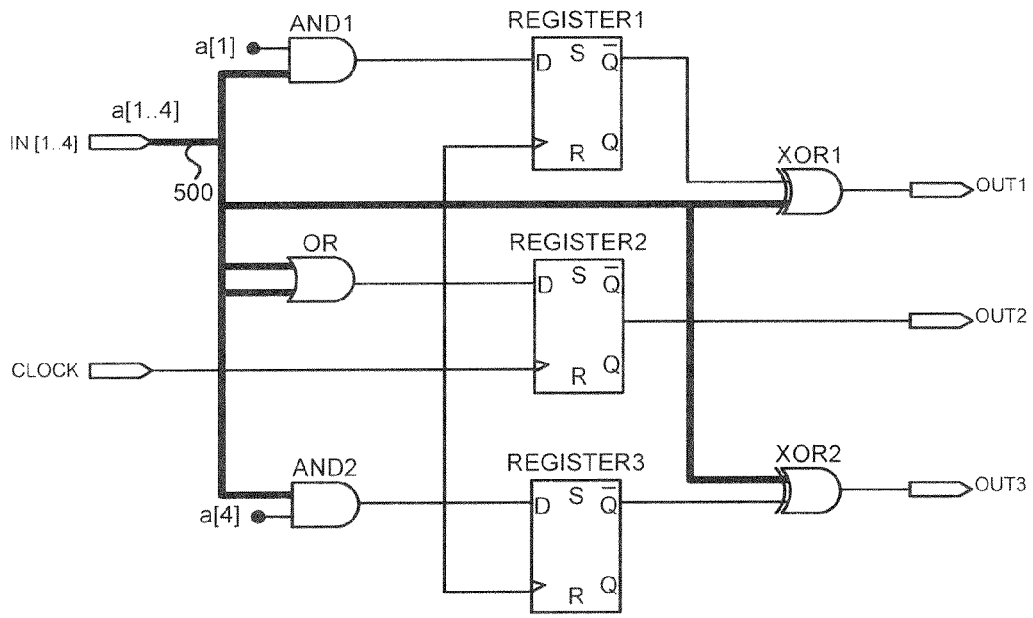

FIGS. 10A and 10B illustrate an embodiment allowing the user to modify representation 200-9B by using an index of the bus net labels. As shown in representation 200-10A of FIG. 10A, dialog box 600 is where the user can select the index of the net to display. In dialog box 600, the "Selection" field 602 displays the index numbers available, and the "Display" 604 field displays the selected index numbers. Dialog box 600 shows bus net labels with index "2" and "3" as being selected for display in the schematic diagram. FIG. 10B shows the resulting representation 200-10B in which the connection lines (depicted as bold lines for illustrative purposes) with bus net labels a[2] and a[3] are displayed on the schematic diagram.

Figure 11:
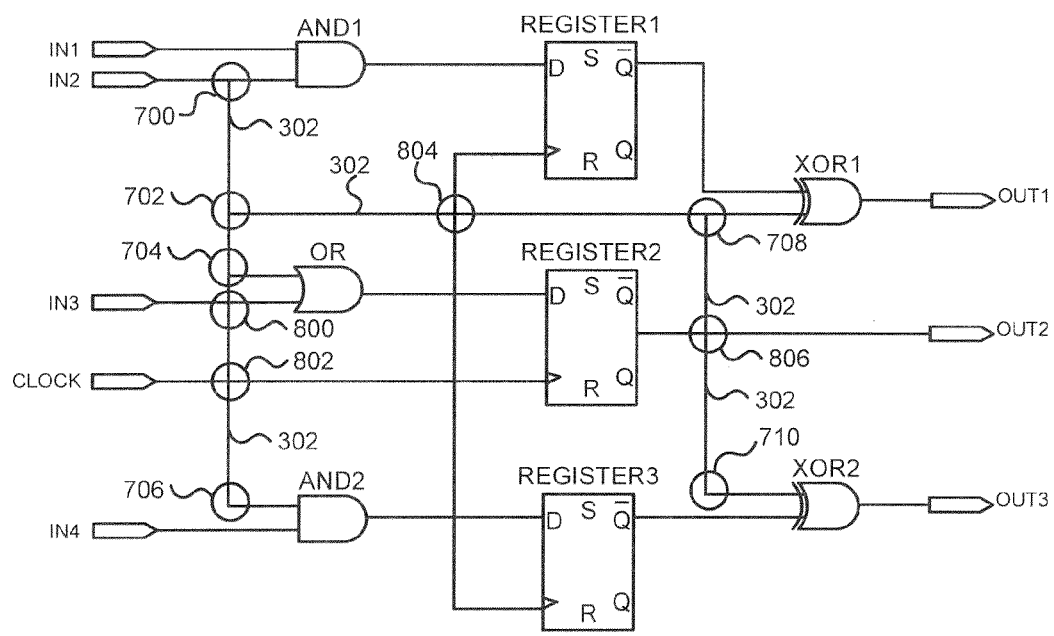
FIG. 11 shows the bends and crossovers in a display of a net if the connection lines are displayed.
Figure 12:
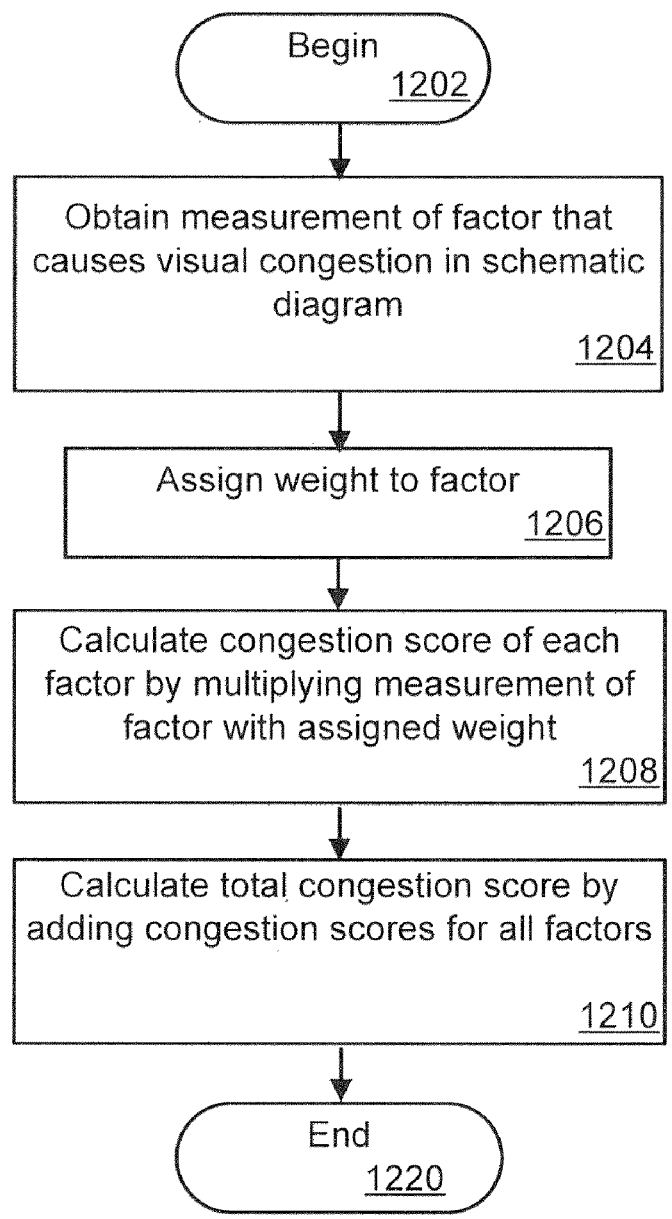
FIG. 12 shows the process flow of a method to calculate the congestion score of a net in the schematic diagram of an IC design, according to one embodiment.

FIGS. 11 and 12 illustrate how, in one embodiment, the connectivity among circuit elements on a schematic diagram can be displayed based on the congestion score of the schematic diagram. The congestion score is calculated based on factors that cause visual congestion in the schematic diagram. These factors include the number of bends that an interconnection makes, the number of crossovers that an interconnection makes, and the number of pixels required to draw an interconnection on the schematic diagram.

In one embodiment, the congestion score is calculated based on the bends that an interconnection makes in the schematic diagram of an IC design. The more bends that an interconnection makes, the more clutter the interconnection causes in the schematic diagram.

In one embodiment, the congestion score is calculated based on the number of crossovers that an interconnection makes in the schematic diagram of an IC design. A crossover occurs when the connection path from a net intersects with the connection path from another net. The more crossovers an interconnection makes, the more visual congestion the interconnection causes in the schematic diagram.

FIG. 11 shows the bends and crossovers that net 302 of FIG. 2 makes if the connection lines of schematic diagram 200 are displayed. There are a total of six bends at 700, 702, 704, 706, 708, and 710. There are a total of four crossovers at 800, 802, 804, and 806.

In one embodiment, the congestion score is calculated based on the number of pixels required to draw an interconnection on the schematic diagram. Interconnections that span a longer length require more pixels to be drawn in the schematic diagram.

FIG. 12 shows the process flow 1200 of a method to calculate the congestion score of a net in the schematic diagram of an IC design, according to one embodiment. This process flow may be used by a computer system and may be embodied in a computer program product embedded in a computer readable medium. A net may have interconnections with bends or crossovers, The pixels required to draw the interconnections also differ from one net to another. The number of bends, crossovers, and pixels drawn are considered as factors that cause visual congestion in a schematic diagram. The larger the number of bends, crossovers, or pixels required to draw a net, the more the net contributes to visual congestion on the schematic diagram. The process flow begins at operation 1202 and proceeds to operation 1204 where the measurement of a factor that causes visual congestion is obtained. For example, in FIG. 11, the number of bends for net 302 is eight. After operation 1204, the flow continues with operation 1206 where a weight is assigned to the factor. As not all factors cause the same amount of visual congestion on the schematic diagram, weights are used to indicate the level of visual congestion each different factor causes. A larger weight value will be given to a factor that potentially causes more visual congestion and a smaller weight value is given to another factor that potentially causes less visual congestion. For example, a bend is given a weight of 50 as it potentially contributes to the most visual congestion, a crossover is given a weight of 20, and a pixel drawn is given a weight of 1 as it potentially contributes least to visual congestion.

In operation 1208, the congestion score for each factor that causes congestion is calculated by multiplying the measurement of the factor with the weight assigned to the factor.

Congestion score=measurement of factor×factor weight

For example, the congestion score for the number of bends of net 302 in FIG. 11 is calculated as follows:

Congestion score for bends in net 302 measurement of bends×bend weight

Congestion score for bends in net 302=8×50=400

In operation 1210, the total congestion score for a net is calculated by combining the congestion scores for all factors. The total congestion score is calculated as follows:

Total congestion score=(number of bends×bend weight)+(number of crossovers×crossover weight)+(number of pixels drawn×pixel weight)

For example, the total congestion score for net 302 in FIG. 11 is calculated as follows:

Total congestion score for net 302=(8×50)+(4×20)+ (500×1)=980

The total congestion score reflects the amount of visual congestion in the schematic diagram. A high congestion score denotes a large amount of clutter in the schematic diagram, whereas a low congestion score means that the schematic diagram is relatively clutter-free. After the calculation of total congestion score in operation 1210, the process flow ends at operation 1220.

Figure 13:
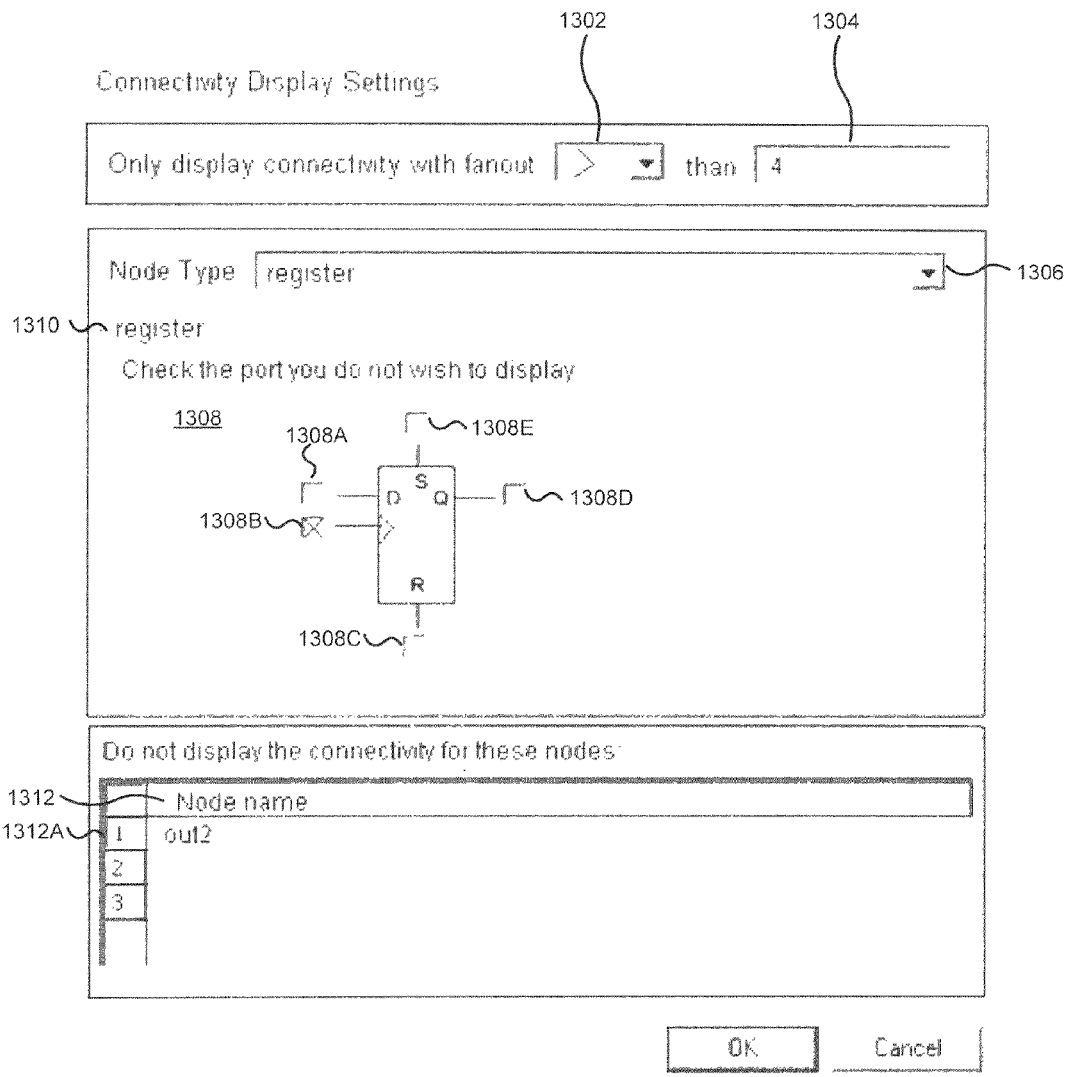
FIG. 13 shows a user interface in which the user can configure the connectivity of a schematic diagram based on certain criteria such as the number of fan-outs, types of circuit elements, types of ports, and circuit element names, according to one embodiment.

FIG. 13 shows a user interface 1300 in which the user can configure the connectivity of a schematic diagram based on certain criteria such as the number of fan-outs, types of circuit elements, types of ports, and circuit element names, according to one embodiment. User interface 1300 allows the user to hide specified interconnections on the schematic diagram using the options provided. For example, to hide interconnections with a specified number of fan-outs, the user can enter the number of fan-outs using fields 1302 and 1304. Field 1302 is a pull-down menu that displays a set of operators such as ">" (more than), "<" (less than), "=" (equal to), and "!-" (no(equal to). Field 1304 is a field that accepts user input in the form of positive integers. In field 1306, the user can select the type of circuit elements to hide in the schematic diagram. Field 1306 is a drop-down menu that displays different types of circuit elements such as "register", "resistor", "nand", "xor", "input pin", and "output pin". Using field 1308, the user can hide the interconnections associated with selected types of ports. Field 1308 shows the input and output ports of a circuit element. For example, field 1308 displays ports 1308A, 1308B, 1308C, 1308D, and 1308E of a register 1310. Using field 1312, the user can hide the interconnections of circuit elements with specified names. For example, the user can enter the name of output pin "OUT2" in field 1312A to exclude the input and output connection lines of "OUT2" from being displayed on the schematic diagram.

Figure 14:
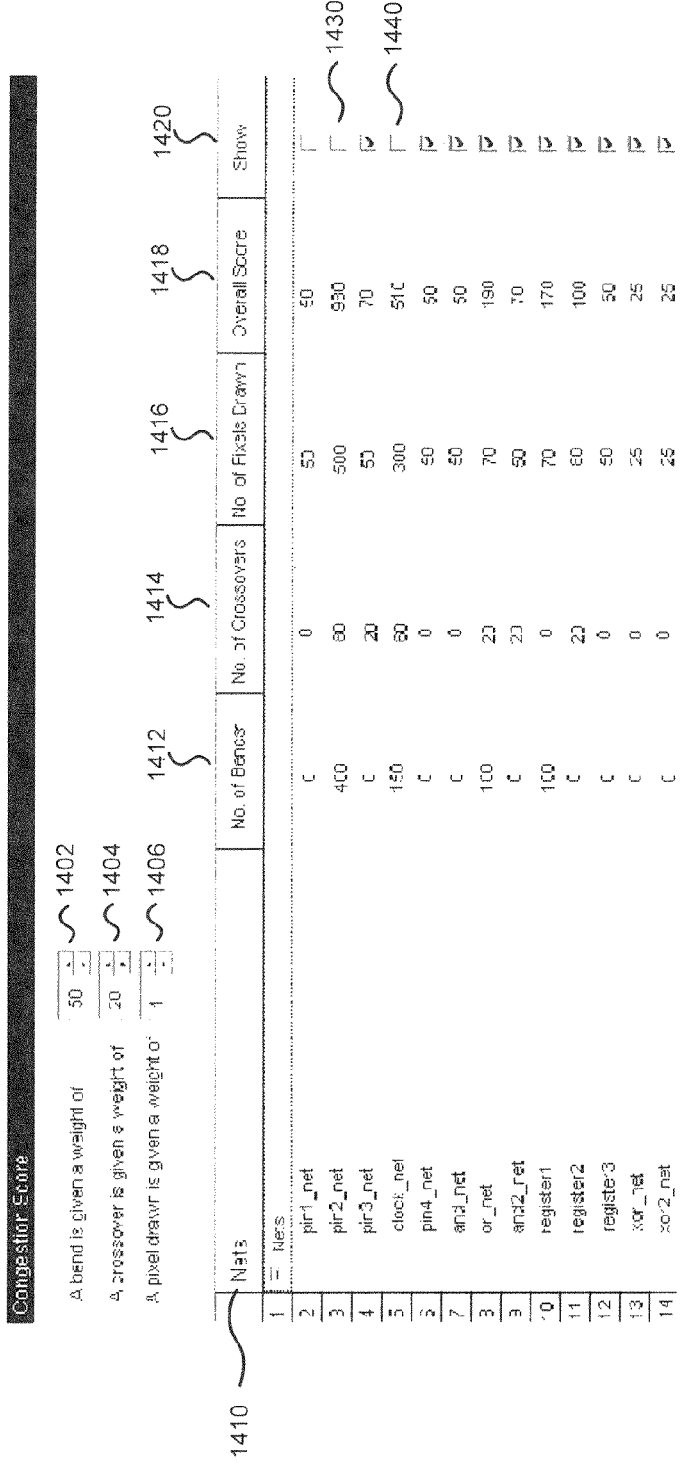
FIG. 14 shows a user interface that enables the user to select a weight for each congestion factor and display the total congestion scores for different nets, according to one embodiment.

FIG. 14 shows a user interface 1400 that enables the user to select a weight for each congestion factor and display the total congestion scores for different nets, according to one embodiment. User interface 1400 has field 1402 for accepting user selection on bend weight, field 1404 for accepting user selection on crossover weight, and field 1406 for accepting user selection on pixel weight. Table 1410 has the "No. of Bends" 1412, "No. of Crossovers" 1414, and "No. of Pixels Drawn" 1416 columns for displaying the congestion score for the bends, crossovers, and pixels of a net, respectively. The "Overall Score" column displays the total congestion score for every net. With the "Show" 1420 column, the user can select the nets to hide in the schematic diagram. The user can decide on the nets to hide by referring to the total congestion score associated with each net. Nets that have high total congestion scores can be hidden to reduce clutter and improve the readability of a schematic diagram. For example, as both IN2_net and CLOCK_net have high total congestion scores, the user can choose to hide the interconnections of these nets by turning off the "Show" options 1430 and 1440.

Figure 15A:
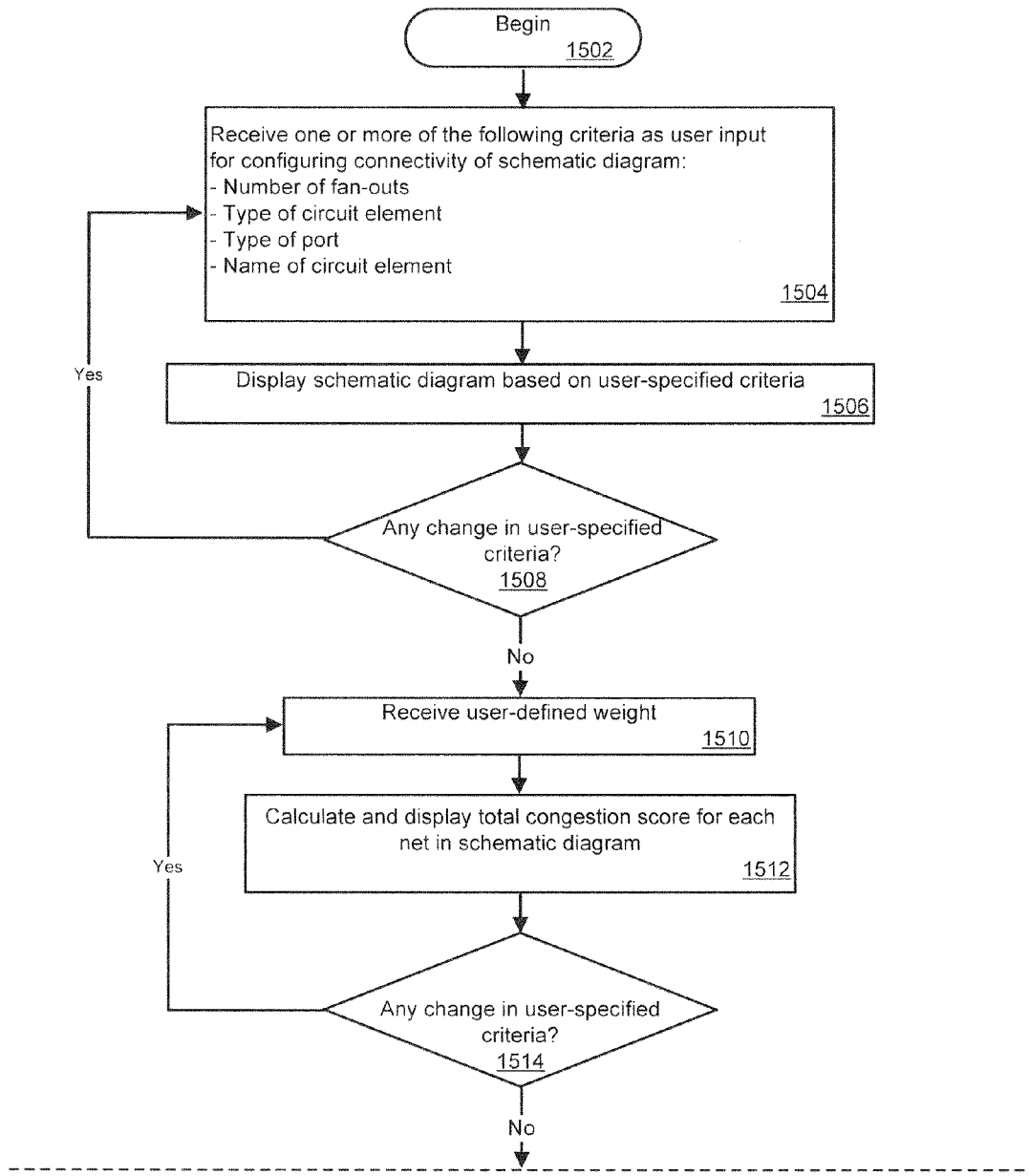
FIG. 15 shows the process flow of a method to configure how the connectivity of a schematic diagram is displayed, according to one embodiment.
Figure 15B:
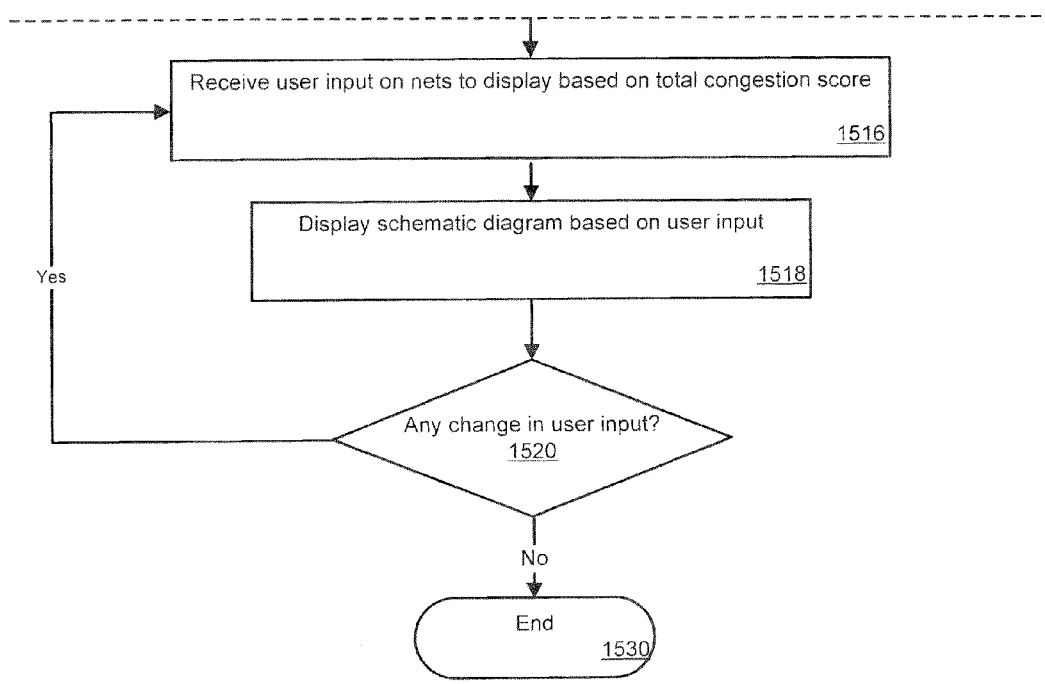

FIG. 15 shows the process flow 1500 of a method to configure the connectivity of a schematic diagram, according to one embodiment. This process flow may be used by a computer system and may be embodied in a computer program product embedded in a computer readable medium. Process flow 1500 begins with operation 1502 and proceeds to operation 1504 where user input is received on configuring the connectivity of a schematic diagram. The user can configure the connectivity based on the number of fan-outs that an interconnection has, the type of circuit elements, the type of I/O ports, and the name of the circuit element. In operation 1506, the schematic diagram is displayed on a display device based on the criteria received from the user in operation 1504. Operation 1508 detects if any of the criteria has changed. If changes have been made, then the process reiterates operations 1504 and 1506. If no changes have been made, then the process continues with operation 1510 where a weight for each factor that causes visual congestion in the schematic diagram is received. Each weight is defined by the user. Based on the weight, the total congestion score is calculated for each net in the schematic diagram and displayed on the display device. The total congestion score provides the amount of clutter caused by each individual net. By knowing the exact amount of clutter contributed by each net, the user can further prune away nets that were not filtered out with the criteria received in operation 1504.

Operation 1514 determines if the user has changed the weight for any of the factors that cause visual congestion. If changes are detected, operations 1510 and 1512 are reiterated to recalculate the new total congestion score for each net. If no changes are detected, the process continues with operation 1516 where the nets selected by the user for display are received. The nets are selected based on the total congestion score associated with each net, where the user can choose not to display nets with relatively high congestion scores. Operation 1518 displays the schematic diagram based on the nets selected by the user in operation 1516. Next, operation 1520 detects if the nets selected for display have been changed. If changes have been made to the selection, then steps 1516 and 1518 are repeated. If not, then the process ends at 1530.

Figure 16:
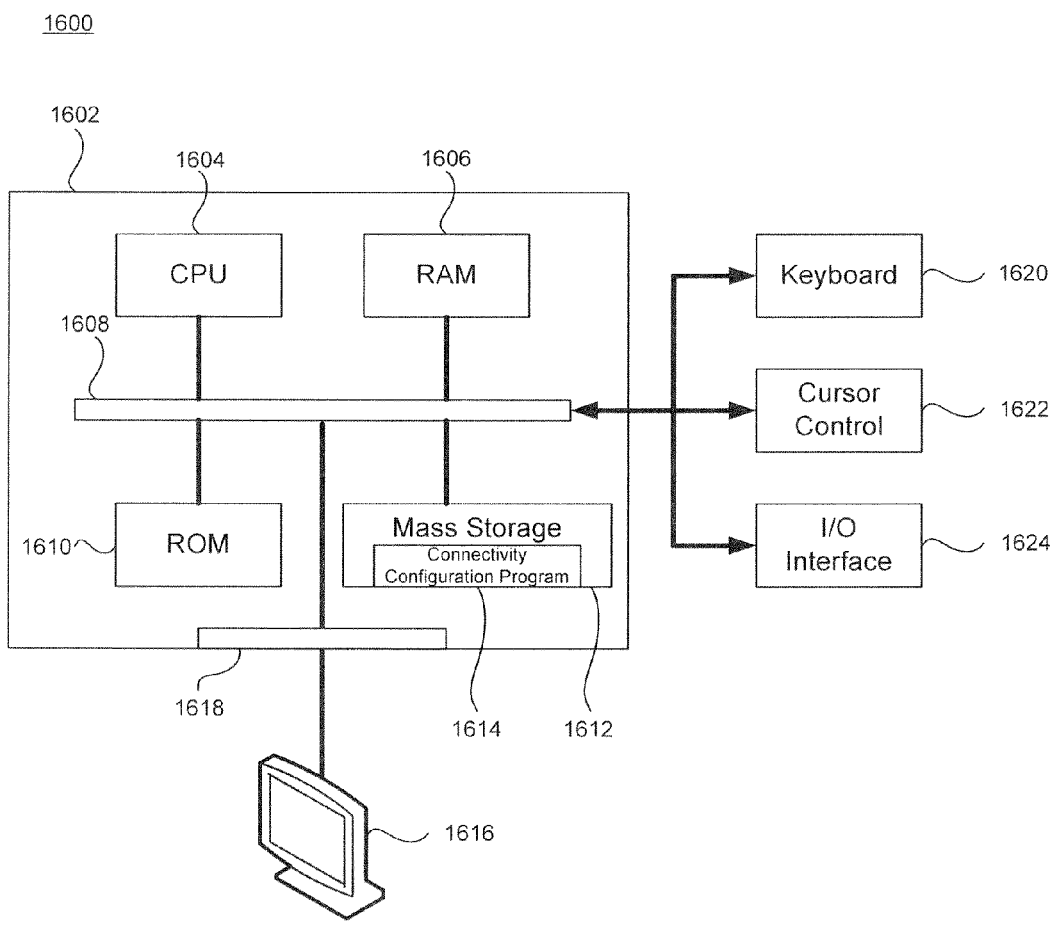
FIG. 16 is a simplified schematic diagram of a computer system 1600 for implementing embodiments of the present invention.

FIG. 16 is a simplified schematic diagram of a computer system 1600 for implementing embodiments of the present invention. It should be appreciated that the methods described herein may be performed with a digital processing system, such as a conventional, general-purpose computer system. Special-purpose computers, which are designed or programmed to perform one function may be used in the alternative. The computer system of FIG. 16 may be used as an interactive system for configuring the connectivity of a schematic diagram based on an IC design. The computer system includes a central processing unit ("CPU") 1604, which is coupled through bus 1608 to random access memory ("RAM") 1606, read-only memory ("ROM") 1610, and mass storage 1612.

Mass storage device 1612 represents a persistent data storage device such as a floppy disc drive or a fixed disc drive, which may be local or remote. Connectivity configuration program 1614 resides in mass storage 1612, but can also reside in RAM 1606 during processing. It should be appreciated that CPU 1604 may be embodied in a general-purpose processor, a special-purpose processor, or a specially programmed logic device.

Display 1616 is in communication with CPU 1604, RAM 1606, ROM 1610, and mass storage device 1612, through bus 1608 and display interface 1618. Display 1616 is configured to display the user interface and schematic diagrams described herein.

Keyboard 1620, cursor positioning device 1622, and I/O interface 1624 are coupled to bus 1608 to communicate information in command selections to CPU 1604. For example, according to one embodiment, net labels can be expanded using a cursor positioning device such as a mouse. User input can also be received as commands selected with a mouse from a dialog box. The user input is then communicated to CPU 1604 through interface 1624. Generally, it should be appreciated that data to and from external devices may be communicated through interface 1624.

Embodiments of the present invention may be practiced with various computer system configurations including handheld devices, microprocessor systems, microprocessor-based or programmable consumer electronics, minicomputers, mainframe computers, and the like. The invention can also be practiced in distributed computing environments where tasks are performed by remote processing devices that are linked through wire-based or wireless network.

The invention can also be embodied as computer readable code on a computer readable medium. The computer readable medium is any data storage device that can store data, which can thereafter be read by a computer system. Examples of the computer readable medium include hard drives, network attached storage ("NAS"), read-only memory, random-access memory, compact disc read-only memory ("CD-ROM"), compact disc recordable ("CD-R"), compact disc rewritable ("CD-RW"), magnetic tapes, and other optical and non-optical data storage devices. The computer readable medium can also be distributed over a network-coupled computer system so that the computer readable code is stored and executed in a distributed fashion.

An example of a suitable software application in which the methods of the present invention can be implemented to modify the application is Quartus® II, an EDA software owned by the assignee. It should be understood that the present invention is not limited solely to incorporation within the previously mentioned software package but can also be incorporated within any suitable EDA software.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The methods, computer program products or systems to configure the connectivity of a schematic diagram described herein may be incorporated into an FDA software for use in designing an IC device. Examples of IC devices are processors and programmable logic devices ("PLD"s). The PLDs can include programmable array logic ("PAL"), programmable logic array ("PLA"), field programmable logic array ("FPLA"), electrically programmable logic devices ("EPLD"), electrically erasable programmable logic device ("EEPLD"), logic cell array ("LCA"), field programmable gate array ("FPGA"), application specific standard product ("ASSP"), application specific integrated circuit ("ASIC"), just to name a few.

The PLDs described herein may be part of a data processing system that includes one or more of the following components; a processor; memory; circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The PLD can be used to perform a variety of different logic functions. For example, the PLD can be configured as a processor or controller that works in cooperation with a system processor. The PLD may also be used as an arbiter for arbitrating access to a shared resource in the data processing system. In yet another example, the PLD can be configured as an interface between a processor and one of the other components in the system. In one embodiment, the PLD may be one of the PLDs owned by Altera Corporation.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of electronically displaying a schematic diagram of an integrated circuit ("IC") device, the method utilizing a computer and the method comprising:
   identifying criteria for displaying a plurality of interconnections between circuit element ports in the IC device; and
   using either net labels or connection lines, depending on the identified criteria, to display the plurality of interconnections on an electronic display device.

2. The method of claim 1, wherein a connection line comprises a graphical line spanning an interconnection, the interconnection corresponding to at least a portion of a net or a bus net.

3. The method of claim 1, wherein a net label uniquely identifies a net.

4. The method of claim 3, wherein the net label is selected from a group consisting of an alphabet character, a combination of alphabet characters, a numeric character, a combination of numeric characters, and a combination of alphanumeric characters.

5. The method of claim 1, wherein the identifying criteria comprises obtaining user input through a graphical user interface ("GUI").

6. The method of claim 1, wherein the criteria comprises a selected number of fan-outs of an interconnection and interconnections having more fan-outs than the selected number are displayed using net labels.

7. The method of claim 1, wherein the criteria comprises a selected port type and interconnections connecting to or from the selected port type are displayed using net labels.

8. The method of claim 1, wherein the criteria comprises a selected circuit element type and interconnections connecting to or from the selected circuit element type are displayed using net labels.

9. The method of claim 1, wherein the criteria comprises a selected circuit element name and interconnections connecting to or from circuit elements with the selected circuit element name are displayed using net labels.

10. The method of claim 1 further comprising calculating a total congestion score based on at least one factor that causes visual congestion when connection lines are used to display the interconnections on the display device, wherein the criteria comprises a selected congestion score and interconnections having a congestion score above the selected congestion score are displayed using net labels.

11. The method of claim 10, wherein the calculating a total congestion score comprises:
    calculating a measurement of the at least one factor;
    assigning a weight to the at least one factor;
    calculating a congestion score for the at least one factor by multiplying the weight with the measurement of the at least one factor; and
    adding the congestion scores for all factors.

12. The method of claim 11, wherein the at least one factor comprises at least one of:
    a number of bends that an interconnection makes;
    a number of crossovers that an interconnection makes; and
    a number of pixels required to draw an interconnection.

13. A computer program product comprising computer code embedded in a non-transitory computer-readable storage medium, the computer code, executable on a computer and the computer code comprising:
    computer code for displaying interconnections between input ports and output ports of a plurality of circuit elements in a schematic diagram;
    computer code for presenting to a user criteria for displaying the interconnections; and
    computer code for displaying the interconnections using connection lines or net labels based on criteria selected by the user.

14. The computer program product of claim 13 wherein the computer code further comprises:
    computer code for calculating a total congestion score, wherein the total congestion score represents visual congestion caused by an interconnection in the schematic diagram; and
    computer code for displaying the total congestion score for each interconnection.

15. The computer program product of claim 14, wherein the computer code for calculating the total congestion score comprises:
    computer code for calculating a number of bends that the interconnection makes multiplied with a bend weight, wherein the bend weight is defined by the user;
    computer code for calculating a number of crossovers that the interconnection makes multiplied with a crossover weight, wherein the crossover weight is defined by the user; and
    computer code for calculating a number of pixels required to draw the interconnection multiplied with a pixel weight, wherein the pixel weight is defined by the user.

16. The computer program product of claim 13, wherein the criteria for displaying the interconnections comprises at least one of:
    interconnections having a specific number of fan-outs;
    interconnections connecting all or specific ports of a circuit element;
    interconnections connecting circuit elements with specified names;
    interconnections connecting circuit elements of specific types; and
    interconnections having a specified total congestion score.

17. A system for interactively editing a schematic diagram of an integrated circuit ("IC") device, the system comprising:
    a computer processor coupled to a display device for displaying the schematic diagram;
    a memory coupled to the computer processor, the memory holding a program for editing the schematic diagram, wherein instructions from the program, when executed by the computer processor, cause the computer processor to:
    present pre-defined criteria for displaying nets between a plurality of input/output ("I/O") ports in the IC device, wherein the pre-defined criteria is presented on the display device;
    obtain user input to identify criteria for displaying the nets, wherein the user input is selected from the pre-defined criteria;
    based on the user input, display the nets on the schematic diagram, wherein connection paths of the nets are depicted using either net labels or connection lines; and
    calculate a total congestion score for each net in the schematic diagram.

18. The system of claim 17, wherein the pre-defined criteria comprises:
    nets having a specific number of fan-outs;
    nets connecting all or specific ports of a circuit element;
    nets connecting circuit elements with specific names; and
    nets connecting circuit elements of specific types.

19. The system of claim 17, wherein the total congestion score is calculated based on factors that cause visual congestion, the factors comprising:
    a number of bends that a net makes in the schematic diagram;
    a number of crossovers that a net makes in the schematic diagram; and
    a number of pixels required to draw a net in the schematic diagram.

20. The system of claim 19, wherein the program instructions to calculate the total congestion score comprises:
    program instructions to obtain a measurement of each factor, wherein the measurement is calculated by the computer processor;
    program instructions to receive a weight for each factor; wherein the weight is defined by a user;
    program instructions to calculate a congestion score for each factor by multiplying the weight with the measurement; and
    program instructions to calculate a total congestion score for a net by combining the congestion score for all factors.

* * * * *